(12) United States Patent
Matsuyama et al.

(10) Patent No.: US 11,764,038 B2
(45) Date of Patent: *Sep. 19, 2023

(54) PLASMA PROCESSING APPARATUS, ELECTROSTATIC ATTRACTION METHOD, AND ELECTROSTATIC ATTRACTION PROGRAM

(71) Applicant: TOKYO ELECTRON LIMITED, Tokyo (JP)

(72) Inventors: Shoichiro Matsuyama, Miyagi (JP); Naoki Tamaru, Miyagi (JP); Yasuharu Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 92 days.

This patent is subject to a terminal disclaimer.

(21) Appl. No.: 16/952,875

(22) Filed: Nov. 19, 2020

(65) Prior Publication Data

US 2021/0074522 A1  Mar. 11, 2021

Related U.S. Application Data

(63) Continuation of application No. 15/995,373, filed on Jun. 1, 2018, now Pat. No. 10,879,050.

(30) Foreign Application Priority Data

Jun. 2, 2017 (JP) .................. 2017-110452

(51) Int. Cl.
*H01J 37/32* (2006.01)
*H01L 21/67* (2006.01)
(Continued)

(52) U.S. Cl.
CPC .. *H01J 37/32642* (2013.01); *H01J 37/32201* (2013.01); *H01J 37/32532* (2013.01);
(Continued)

(58) Field of Classification Search
None
See application file for complete search history.

(56) References Cited

U.S. PATENT DOCUMENTS

| 9,922,857 B1* | 3/2018 | Kimball ................... H01J 37/00 |
| 2003/0165044 A1* | 9/2003 | Yamamoto ............. H02N 13/00 361/234 |

(Continued)

FOREIGN PATENT DOCUMENTS

| CN | 101847558 A | | 9/2010 | |
| EP | 2881981 | * | 6/2015 | ......... H01L 21/6833 |

(Continued)

*Primary Examiner* — Ram N Kackar
(74) *Attorney, Agent, or Firm* — WEIHROUCH IP

(57) ABSTRACT

A plasma processing apparatus includes a processing chamber that performs a plasma processing using plasma; a placing table provided in the processing chamber and including a substrate placing portion and a focus ring placing portion, the focus ring placing portion surrounding the substrate placing portion; a focus ring disposed on the focus ring placing portion; a first electrode and a second electrode both disposed inside the focus ring placing portion; a DC power source configured to apply a first DC voltage to the first electrode and apply a second DC voltage to the second electrode; and a controller configured to control the DC power source such that respective polarities of the first DC voltage and the second DC voltage are independently and periodically switched.

7 Claims, 8 Drawing Sheets

(51) Int. Cl.
*H01L 21/687* (2006.01)
*H01L 21/683* (2006.01)

(52) U.S. Cl.
CPC .. *H01J 37/32633* (2013.01); *H01J 37/32706* (2013.01); *H01L 21/67069* (2013.01); *H01L 21/6833* (2013.01); *H01L 21/68785* (2013.01)

(56) References Cited

U.S. PATENT DOCUMENTS

| | | |
|---|---|---|
| 2004/0261946 A1 | 12/2004 | Endoh et al. |
| 2009/0109595 A1 | 4/2009 | Herchen et al. |
| 2010/0243606 A1 | 9/2010 | Koshimizu et al. |
| 2014/0158301 A1* | 6/2014 | Maehira ............ H01J 37/32715 156/345.29 |
| 2016/0189994 A1 | 6/2016 | Sasaki et al. |

FOREIGN PATENT DOCUMENTS

| | | |
|---|---|---|
| JP | 61-004611 B2 | 2/1986 |
| JP | 06-244271 A | 9/1994 |
| JP | 2016-122740 A | 7/2016 |
| KR | 10-2014-053323 A | 5/2014 |
| KR | 10-2016-0078917 A | 7/2016 |
| WO | 2013/027584 A1 | 2/2013 |

* cited by examiner

PLASMA PROCESSING APPARATUS, ELECTROSTATIC ATTRACTION METHOD, AND ELECTROSTATIC ATTRACTION PROGRAM

CROSS-REFERENCE TO RELATED APPLICATIONS

This application is a continuation of U.S. patent application Ser. No. 15/995,373, filed on Jun. 1, 2018, which claims priority from Japanese Patent Application No. 2017-110452 filed on Jun. 2, 2017, all of which are incorporated herein in their entireties by reference.

TECHNICAL FIELD

Various aspects and exemplary embodiments of the present disclosure relate to a plasma processing apparatus, an electrostatic attraction method, and an electrostatic attraction program.

BACKGROUND

In the related art, there has been known a plasma processing apparatus that performs a plasma processing (e.g., etching) on a workpiece (e.g., a semiconductor wafer) using plasma. In such a plasma processing apparatus, a focus ring is provided on the outer peripheral portion of the workpiece for the purpose of making the plasma uniform.

In the plasma processing apparatus, the following technique for suppressing displacement of the focus ring has been known. In the plasma processing apparatus, an electrostatic chuck is provided on a placing table on which the focus ring is placed, and a constant voltage is applied to the electrostatic chuck during a plasma processing period. Thus, the focus ring is attracted by an electrostatic force of the electrostatic chuck. See, for example, Japanese Patent Laid-Open Publication No. 2016-122740.

SUMMARY

In an aspect of the present disclosure, a plasma processing apparatus includes a placing table and a voltage application unit. The placing table includes a focus ring placed thereon and an electrode provided therein so as to face the focus ring. The voltage application unit applies, to the electrode, voltages of different polarities in cycles or a voltage having a large absolute value in steps, during a plasma processing period.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
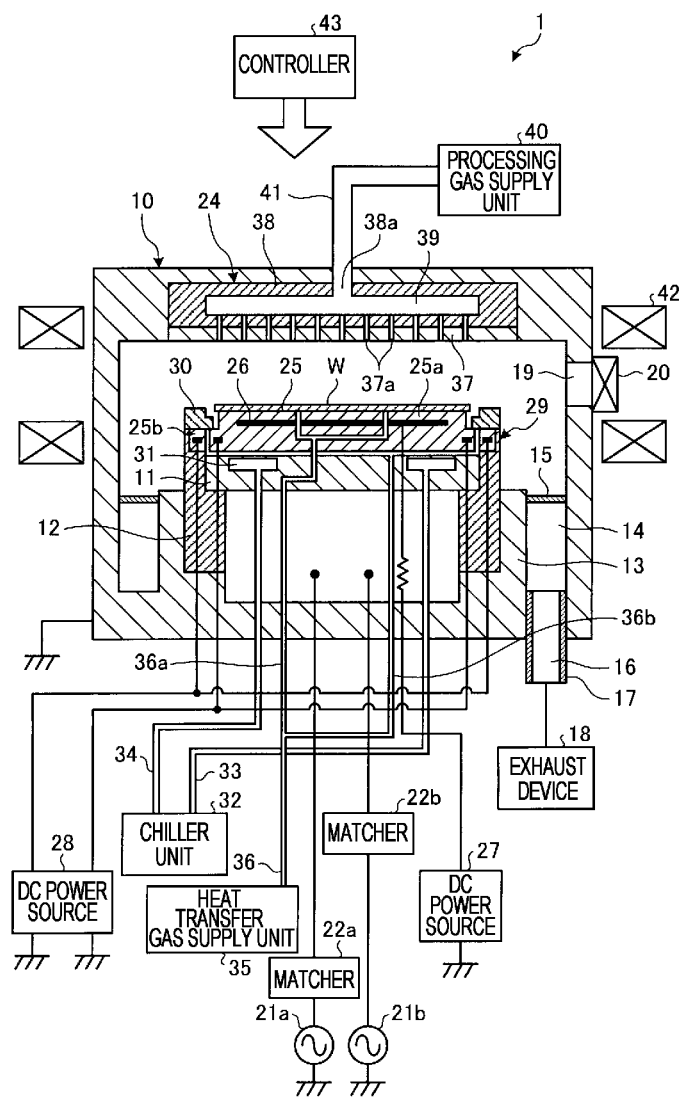
FIG. 1 is a cross-sectional view illustrating a schematic configuration of a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In recent years, a plasma processing apparatus tends to have a prolonged plasma processing period for the workpiece. For example, in a three-dimensional NAND flash memory, the number of stacked layers tends to increase as the generation of devices advances, and the plasma processing period required for processing is also prolonged.

In the plasma processing apparatus, however, in the case where the focus ring is attracted by applying a constant voltage to the electrostatic chuck, the attraction force of the focus ring may decrease when the plasma processing period is prolonged.

In an aspect of the present disclosure, a plasma processing apparatus includes a placing table and a voltage application unit. The placing table includes a focus ring placed thereon and an electrode provided therein so as to face the focus ring. The voltage application unit applies, to the electrode, voltages having different polarities in cycles or a voltage having a large absolute value in steps, during a plasma processing period.

In the above-described plasma processing apparatus, the placing table includes a plurality of electrodes provided in a radial direction of the focus ring.

In the above-described plasma processing apparatus, the voltage application unit is configured to switch the polarities of the voltages applied to the plurality of electrodes at once or sequentially one by one.

In the above-described plasma processing apparatus, the voltage application unit is configured to apply voltages of different polarities to the plurality of electrodes in each cycle.

In another aspect of the present disclosure, an electrostatic attraction method includes applying, to an electrode provided in a placing table including a focus ring placed thereon so as to face the focus ring, voltages having different polarities in cycles or a voltage having a large absolute value in steps, during a plasma processing period.

In still another aspect of the present disclosure, a non-transitory computer-readable storage medium that stores an electrostatic attraction program which, when executed, causes a computer to execute a processing including: applying, to an electrode provided in a placing table including a focus ring placed thereon so as to face the focus ring, voltages having different polarities in cycles or a voltage having a large absolute value in steps, during a plasma processing period.

According to various aspects and embodiments of the present disclosure, it is possible to suppress the decrease in the attraction force of the focus ring.

Hereinafter, exemplary embodiments of the plasma processing apparatus, the electrostatic attraction method, and the electrostatic attraction program disclosed herein will be described in detail with reference to drawings. In the respective drawings, the same or corresponding parts will be denoted by the same symbols. Further, the present disclosure is not limited to the exemplary embodiments disclosed herein. The respective exemplary embodiments may be appropriately combined within a range that does not contradict the processing contents.

FIG. 1 is a cross-sectional view illustrating a schematic configuration of a plasma processing apparatus according to an exemplary embodiment. In the present exemplary embodiment, descriptions will be made on an example in which a plasma processing apparatus 1 is a reactive ion etching (RIE) type plasma processing apparatus, but the plasma processing apparatus 1 may be a plasma etching apparatus using surface wave plasma or a plasma CVD apparatus.

In FIG. 1, the plasma processing apparatus 1 includes a cylindrical processing container 10 which is made of metal, for example, aluminum or stainless steel and is grounded for safety, and a disk-shaped susceptor (lower electrode) 11 provided in the processing container 10 and configured to place thereon a semiconductor wafer (hereinafter referred to as a "wafer") W as a workpiece (substrate). The susceptor 11 is made of, for example, aluminum, and is supported by a cylindrical support portion 13 extending vertically upward from the bottom of the processing container 10 via an insulating cylindrical holding member 12.

An exhaust path 14 is formed between the side wall of the processing container 10 and the cylindrical support portion 13. An annular baffle plate 15 is disposed at the inlet or midway of the exhaust path 14. An exhaust port 16 is provided at the bottom of the exhaust path 14. An exhaust device 18 is connected to the exhaust port 16 via an exhaust pipe 17. Here, the exhaust device 18 has a vacuum pump to reduce the pressure in the processing container 10 to a predetermined degree of vacuum. Further, the exhaust pipe 17 has an automatic pressure control valve (hereinafter, referred to as an "APC") (not illustrated) which is a variable type butterfly valve, and the APC automatically controls the pressure in the processing container 10. Furthermore, a gate valve 20 is attached to the side wall of the processing container 10 to open and close the carry-in/out port 19 for the wafer W.

A first high frequency power source 21a is connected to the susceptor 11 via a first matcher 22a. Further, a second high frequency power source 21b is connected to the susceptor 11 via a second matcher 22b. The first high frequency power source 21a is a power source for plasma generation, which supplies high frequency power of a predetermined frequency (e.g., 100 MHz) to the susceptor 11 during the plasma processing. The second high frequency power source 21b is a power source for ion attraction (bias), which supplies high frequency power of a predetermined frequency lower than that of the first high frequency power source 21a (e.g., 13 MHz) to the susceptor 11 during the plasma processing. On the ceiling portion of the processing container 10, a shower head 24 is disposed as an upper electrode having a ground potential (to be described below). Therefore, a high frequency voltage of two frequencies from the first high frequency power source 21a and the second high frequency power source 21b is applied between the susceptor 11 and the shower head 24.

An electrostatic chuck 25 is provided on the upper surface of the susceptor 11 to attract the wafer W by an electrostatic attraction force. The electrostatic chuck 25 has a disk-shaped central portion 25a on which the wafer W is placed and an annular outer peripheral portion 25b which is formed so as to surround the central portion 25a. The central portion 25a protrudes upward in the drawing with respect to the outer peripheral portion 25b. A focus ring 30 is placed on the upper surface of the outer peripheral portion 25b so as to annularly surround the central portion 25a. Further, the central portion 25a is formed by sandwiching an electrode plate 26 made of a conductive film between a pair of dielectric films. The outer peripheral portion 25b is formed by sandwiching an electrode plate 29 made of a conductive film between a pair of dielectric films. In the present exemplary embodiment, two electrode plates 29 are arranged side by side in an annular axial direction. The electrode plate 26 is electrically connected with a DC power source 27. The two electrode plates 29 are individually electrically connected with a DC power source 28. The DC power source 27 and the DC power source 28 are capable of changing the level and polarity of a DC voltage to be supplied. The DC power source 27 applies a DC voltage to the electrode plate 26 under the control of a controller 43 (to be described later). The DC power source 28 individually applies a DC voltage to the two electrode plates 29 under the control of the controller 43 (to be described later). The electrostatic chuck 25 generates an electrostatic force (e.g., Coulomb force) by the voltage applied from the DC power source 27 to the electrode plate 26 and attracts and holds the wafer W to the electrostatic chuck 25 by the electrostatic force. Further, the electrostatic chuck 25 generates an electrostatic force (e.g., Coulomb force) by the voltage applied from the DC power source 28 to the electrode plates 29 and attracts and holds the focus ring 30 to the electrostatic chuck 25 by the electrostatic force. Details of the installation aspect of the electrode plates 29 will be described later.

Further, an annular coolant chamber 31, for example, extending in the circumferential direction is provided inside the susceptor 11. A coolant of a predetermined temperature, for example, cooling water is circularly supplied from a chiller unit 32 to the coolant chamber 31 through pipes 33 and 34, and the processing temperature of the wafer W on the electrostatic chuck 25 is controlled by the temperature of the coolant.

Further, the electrostatic chuck 25 is connected with a heat transfer gas supply unit 35 through a gas supply line 36. The gas supply line 36 is branched into a wafer side line 36a reaching the central portion 25a of the electrostatic chuck 25 and a focus ring side line 36b reaching the outer peripheral portion 25b of the electrostatic chuck 25. The heat transfer gas supply unit 35 supplies a heat transfer gas to a space sandwiched between the central portion 25a of the electrostatic chuck 25 and the wafer W, using the wafer side line 36a. In addition, the heat transfer gas supply unit 35 supplies a heat transfer gas to a space sandwiched between the outer peripheral portion 25b of the electrostatic chuck 25 and the focus ring 30, using the focus ring side line 36b. As the heat transfer gas, a gas having thermal conductivity (e.g., He gas) is suitably used. The heat transfer gas corresponds to an example of a heat medium, and the heat transfer gas supply unit 35 corresponds to an example of a supply unit that supplies the heat medium.

The shower head 24 at the ceiling portion includes a lower electrode plate 37 having a number of gas vent holes 37a and an electrode support 38 that detachably supports the electrode plate 37. Further, a buffer chamber 39 is provided inside the electrode support 38, and a gas introduction port 38a of the buffer chamber 39 is connected with a gas supply pipe 41 from a processing gas supply unit 40. Further, magnets 42 are arranged around the processing container 10 so as to extend annularly or concentrically.

Each constituent element of the plasma processing apparatus 1 is connected to the controller 43. For example, the exhaust device 18, the first high frequency power source 21a, the second high frequency power source 21b, the DC power sources 27 and 28, the chiller unit 32, the heat transfer gas supply unit 35, and the processing gas supply unit 40 are connected to the controller 43. The controller 43 controls each constituent element of the plasma processing apparatus 1.

The controller 43 includes a central processing unit (CPU) and a storage device (e.g., a memory) (all not illustrated), and reads out and executes a program and a processing recipe stored in the storage device, thereby executing a desired processing in the plasma processing apparatus 1. For example, the controller 43 performs an electrostatic attraction processing for electrostatically attracting the focus ring 30. Details of the electrostatic attraction processing executed by the controller 43 will be described later.

In the processing container 10 of the plasma processing apparatus 1, a horizontal magnetic field directed in one direction is formed by the magnets 42, and a vertical RF electric field is formed by a high frequency voltage applied between the susceptor 11 and the shower head 24. Therefore, magnetron discharge is performed through the processing gas in the processing container 10, and high density plasma is generated from the processing gas in the vicinity of the surface of the susceptor 11.

In the plasma processing apparatus 1, at the time of a dry etching processing, the gate valve 20 is first opened, so that a wafer W to be processed is carried into the processing container 10 and placed on the electrostatic chuck 25. Then, in the plasma processing apparatus 1, a processing gas (e.g., a mixed gas containing $C_4F_8$ gas, $O_2$ gas, and Ar gas in a predetermined flow rate ratio) is introduced into the processing container 10 at a predetermined flow rate and flow rate ratio from the processing gas supply unit 40, and the pressure in the processing container 10 is set to a predetermined value by, for example, the exhaust device 18. Furthermore, in the plasma processing apparatus 1, high frequency power is supplied from each of the first high frequency power source 21a and the second high-frequency power source 21b to the susceptor 11. In addition, in the plasma processing apparatus 1, a DC voltage is applied from the DC power source 27 to the electrode plate 26 of the electrostatic chuck 25, so that the wafer W is attracted onto the electrostatic chuck 25. Further, in the plasma processing apparatus 1, a DC voltage is applied from the DC power source 28 to the electrode plates 29 of the electrostatic chuck 25, so that the focus ring 30 is attracted onto the electrostatic chuck 25. The processing gas ejected from the shower head 24 is converted into plasma as described above, and the surface of the wafer W is etched by radicals and ions generated by the plasma.

Figure 2:
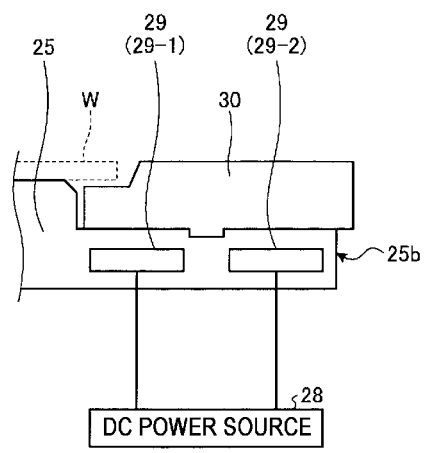
FIG. 2 is a view illustrating an exemplary installation aspect of an electrode plate.

Next, an installation aspect of the electrode plates 29 illustrated in FIG. 1 will be described. FIG. 2 is a view illustrating an exemplary installation aspect of the electrode plates. As illustrated in FIG. 2, the two electrode plates 29 are provided in a region corresponding to the focus ring 30 inside the outer peripheral portion 25b of the electrostatic chuck 25. Hereinafter, among the two electrode plates 29, the inner electrode plate 29 is regarded as an inner peripheral electrode plate 29-1, and the outer electrode plate 29 is regarded as an outer peripheral electrode plate 29-2.

The inner peripheral electrode plate 29-1 is annularly arranged on the inner peripheral side of the focus ring 30. The outer peripheral electrode plate 29-2 is annularly arranged on the outer peripheral side of the focus ring 30. The inner peripheral electrode plate 29-1 and the outer peripheral electrode plate 29-2 are electrically connected to the DC power source 28. In the present exemplary embodiment, descriptions will be made on a case where power is supplied from one DC power source 28 to the inner peripheral electrode plate 29-1 and the outer peripheral electrode plate 29-2. However, two DC power sources 28 may be provided corresponding to the inner peripheral electrode plate 29-1 and the outer peripheral electrode plate 29-2, so that power may be individually supplied thereto.

Recently, however, the plasma processing apparatus 1 tends to have a prolonged plasma processing period for the wafer W. For example, in a three-dimensional NAND flash memory, the number of stacked layers tends to increase as the generation of devices advances, and the plasma processing period required for processing is also prolonged. Thus, in the plasma processing apparatus 1, it is necessary to maintain the attraction force of the electrostatic chuck 25 for a long time (e.g., 60 minutes), for example, in order to construct a three-dimensional NAND process.

However, in the plasma processing apparatus 1, when the plasma processing period is prolonged under a high temperature and high bias environment, a phenomenon occurs in which the attraction force of the electrostatic chuck 25 decreases. For example, in the plasma processing apparatus 1, as the plasma processing period increases, the attraction force of the focus ring 30 to the electrostatic chuck 25 decreases.

For the electrostatic chuck 25, ceramic is used as a dielectric. Examples of the ceramic include an alumina plate, sprayed ceramic, yttria plate, and sprayed FC. In such ceramics, the resistivity tends to decrease as the temperature increases. Therefore, in a high temperature and high bias environment, a phenomenon occurs in which charges are migrated to the dielectric of the dielectric film constituting the electrostatic chuck 25 and the attraction force of the electrostatic chuck 25 decreases.

Figure 3:
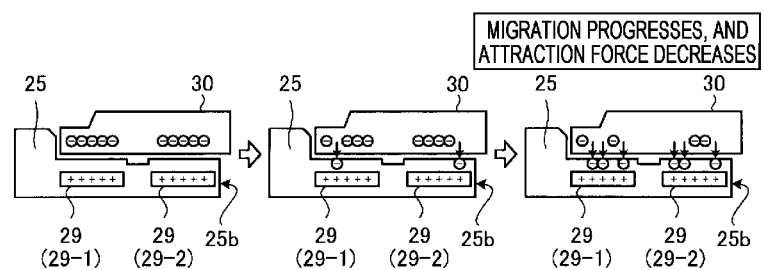
FIG. 3 is a diagram schematically illustrating migration of charges according to a technique in the related art.

FIG. 3 is a diagram schematically illustrating migration of charges according to a technique in the related art. In FIG. 3, the configuration of the outer peripheral portion 25b of the electrostatic chuck 25 is illustrated in a simplified manner. The electrostatic chuck 25 includes an inner peripheral electrode plate 29-1 and an outer peripheral electrode plate 29-2. For example, as in the related art, a constant positive voltage is applied to the inner peripheral electrode plate 29-1 and the outer peripheral electrode plate 29-2 to attract the focus ring 30. In this case, for example, as illustrated in FIG. 3, negative charges of the focus ring 30 migrate to the inner peripheral electrode plate 29-1 and the outer peripheral electrode plate 29-2, and the attraction force of the focus ring 30 to the electrostatic chuck 25 decreases.

In the plasma processing apparatus 1, leakage of the heat transfer gas supplied between the focus ring 30 and the electrostatic chuck 25 increases when the attraction force of the focus ring 30 to the electrostatic chuck 25 decreases.

In the plasma processing apparatus 1, as the leakage of the heat transfer gas increases, the efficiency of extracting heat from the focus ring 30 decreases, and the focus ring 30 is heated to a high temperature due to heat from the plasma processing. Thus, the processing characteristics of the plasma processing fluctuate. Further, in the plasma processing apparatus 1, as the leakage of the heat transfer gas increases, the degree of vacuum decreases, so that the characteristics of the plasma changes. Thus, the processing characteristics of the plasma processing fluctuate.

Figure 4:
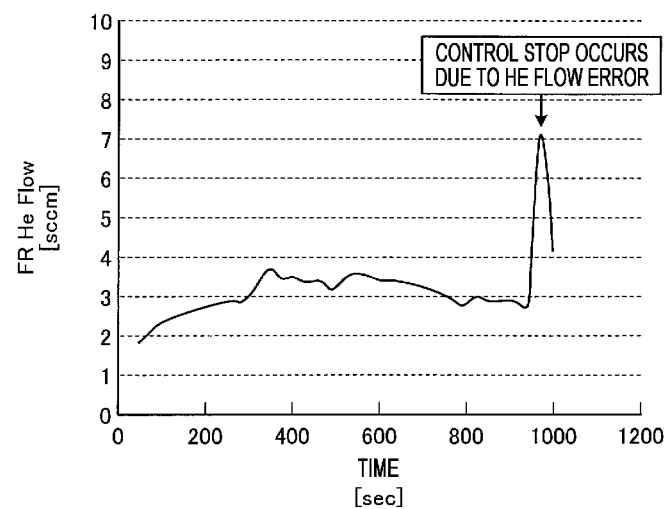
FIG. 4 is a graph illustrating an example of a result of a test of measuring a leakage amount of a heat transfer gas according to a technique in the related art.

FIG. 4 is a graph illustrating an example of a result of a test of measuring a leakage amount of a heat transfer gas according to a technique in the related art. FIG. 4 illustrates an example of a result of a test of measuring a leakage amount of the heat transfer gas supplied to the space sandwiched between the electrostatic chuck 25 and the focus ring 30 by applying a constant positive voltage to the inner peripheral electrode plate 29-1 and the outer peripheral electrode plate 29-2 to attract the focus ring 30. In FIG. 4, the vertical axis represents a leakage amount (sccm) of He gas supplied as a heat transfer gas to the space sandwiched between the electrostatic chuck 25 and the focus ring 30. The horizontal axis illustrates an elapsed time (sec) from the start of the attraction of the focus ring 30. In the example of FIG. 4, an error in which the leakage amount of He gas abruptly increases in the vicinity of the lapse of 1,000 seconds has occurred, and the control stop has occurred.

Therefore, the controller 43 controls the DC power sources 27 and 28 so as to apply voltages of different polarities in cycles, during the plasma processing period. For example, during the plasma processing period, the controller 43 controls the DC power source 28 so as to apply voltages of different polarities to the inner peripheral electrode plate 29-1 and the outer peripheral electrode plate 29-2 in cycles.

Figure 5:
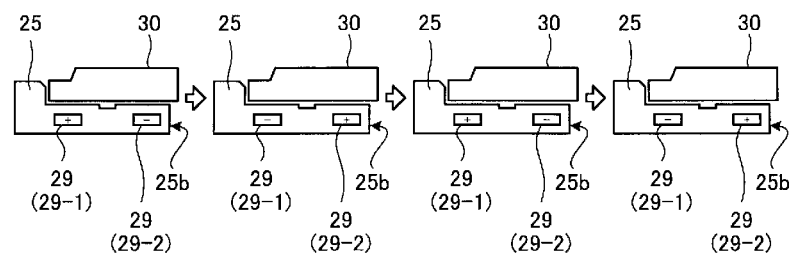
FIG. 5 is a diagram schematically illustrating a change pattern of an applied voltage.

FIG. 5 is a diagram schematically illustrating an exemplary change pattern of an applied voltage. In FIG. 5, the configuration of the outer peripheral portion 25b of the electrostatic chuck 25 is illustrated in a simplified manner. For example, during the plasma processing period, the controller 43 controls the DC power source 28 to apply voltages of different polarities to the inner peripheral electrode plate 29-1 and the outer peripheral electrode plate 29-2 in cycles. In the example of FIG. 5, positive and negative voltages are alternately applied to the inner peripheral electrode plate 29-1 and the outer peripheral electrode plate 29-2.

Figure 6:
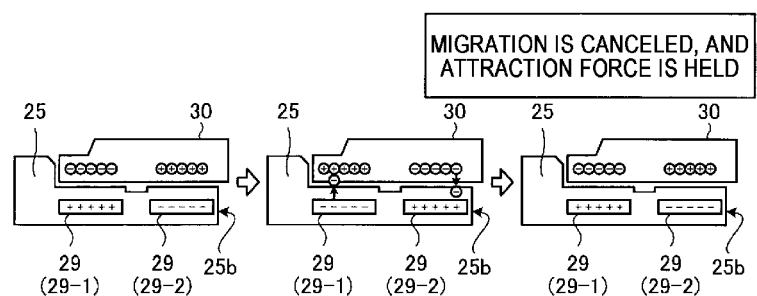
FIG. 6 is a diagram schematically illustrating migration of charges according to the exemplary embodiment.

FIG. 6 is a diagram schematically illustrating migration of charges according to the exemplary embodiment. Migration of charges occurs on the inner peripheral electrode plate 29-1 and the outer peripheral electrode plate 29-2 when a voltage is applied, but the polarity of the applied voltage changes in cycles, so that the migration is canceled. Thus, the attraction force of the focus ring 30 to the electrostatic chuck 25 may be maintained.

Figure 7:
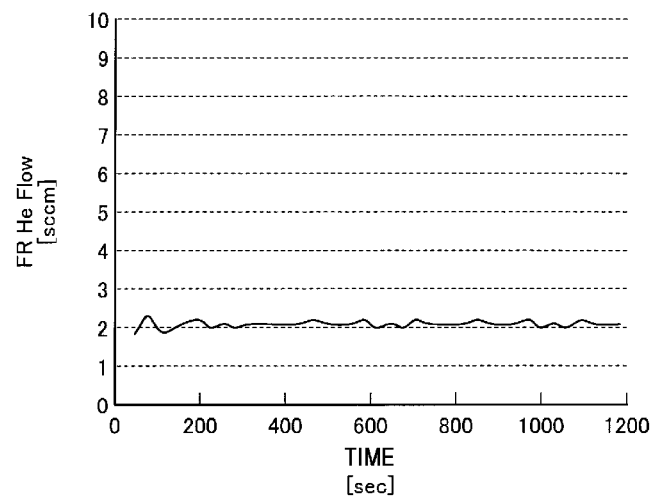
FIG. 7 is a graph illustrating an example of a result of a test of measuring a leakage amount of a heat transfer gas according to the exemplary embodiment.

FIG. 7 is a graph illustrating an example of a result of a test of measuring a leakage amount of a heat transfer gas according to the exemplary embodiment. FIG. 7 illustrates an example of a result of a test of measuring a leakage amount of the heat transfer gas supplied to the space sandwiched between the electrostatic chuck 25 and the focus ring 30 by alternately applying constant positive and negative voltages to the inner peripheral electrode plate 29-1 and the outer peripheral electrode plate 29-2, as illustrated in FIG. 5, to attract the focus ring 30. In FIG. 7, the vertical axis represents a leakage amount (sccm) of He gas supplied as a heat transfer gas to the space sandwiched between the electrostatic chuck 25 and the focus ring 30. The horizontal axis illustrates an elapsed time (sec) from the start of the attraction of the focus ring 30. The cycle of switching the applied voltages is, for example, 300 seconds. When voltages having different polarities are applied to the inner peripheral electrode plate 29-1 and the outer peripheral electrode plate 29-2 in cycles, the attraction force of the focus ring 30 to the electrostatic chuck 25 is capable of being maintained. Therefore, as illustrated in FIG. 7, even when 1,000 seconds have elapsed, the leakage amount of He gas may be maintained without being greatly increased.

Figure 8:
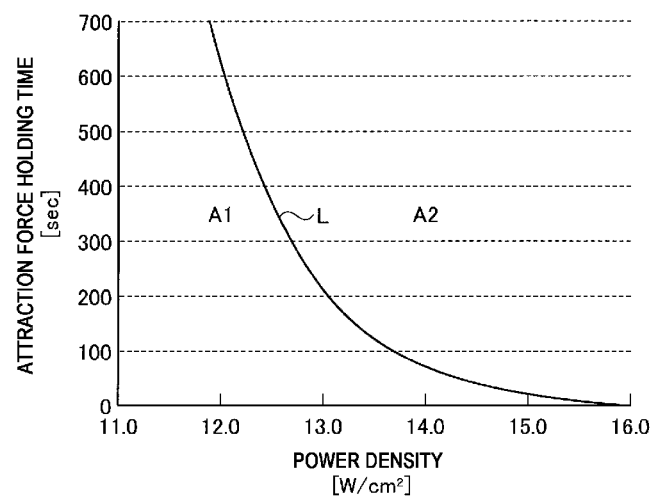
FIG. 8 is a graph illustrating an exemplary relationship between a power density and a switching cycle.

The charge is migrated faster as the voltage applied to the inner peripheral electrode plate 29-1 and the outer peripheral electrode plate 29-2 is higher and the power density of the portion facing the focus ring 30 of the electrostatic chuck 25 is higher. Therefore, the switching cycle of switching the polarity of the voltage applied to the inner peripheral electrode plate 29-1 and the outer peripheral electrode plate 29-2 may be shorter as the applied voltage is higher and the power density is higher. FIG. 8 is a graph illustrating an exemplary relationship between the power density and the switching cycle. In FIG. 8, the vertical axis represents a holding time (sec) for attracting and holding the focus ring 30 during plasma processing. The horizontal axis represents a power density (W/cm$^2$) of a portion of the electrostatic chuck 25 facing the focus ring 30. The graph L illustrated in FIG. 8 represents a holding time at which the leak amount abruptly increases when the focus ring 30 is attracted by the power density. In the plasma processing, in a case where the holding time of the focus ring 30 is in a region A1 on the left side of the graph L with respect to the power density when attracting the focus ring 30, the attraction force of the focus ring 30 is capable of being maintained even though the polarity of the applied voltage is not switched. Meanwhile, in the plasma processing, in a case where the holding time of the focus ring 30 is in a region A2 on the right side of the graph L with respect to the power density when attracting the focus ring 30, the attraction force of the focus ring 30 is incapable of being maintained unless the polarity of the applied voltage is switched. The switching cycle of the applied voltage is set to a cycle of the holding time that is in the region A1 with respect to the power density.

Figure 9A:
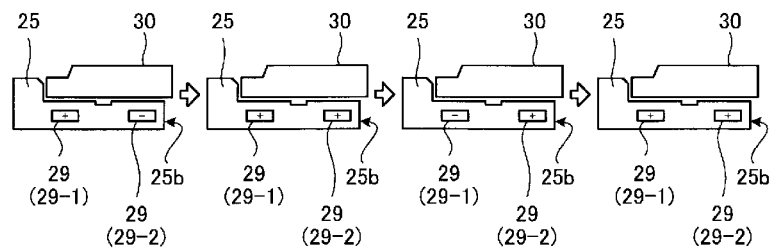
FIG. 9A is a diagram schematically illustrating an exemplary change pattern of the applied voltage.

The pattern of the change in the applied voltage is not limited thereto. FIG. 9A is a diagram schematically illustrating an exemplary change pattern of the applied voltage. For example, during the plasma processing period, the controller 43 may control the DC power source 28 to alternately change the polarities of the voltages applied to the inner peripheral electrode plate 29-1 and the outer peripheral electrode plate 29-2. In the example of FIG. 9A, the polarities of the voltages applied to the inner peripheral electrode plate 29-1 and the outer peripheral electrode plate 29-2 are alternately switched in turn.

Further, one or three or more electrode plates 29 may be formed in the outer peripheral portion 25b.

Figure 9B:
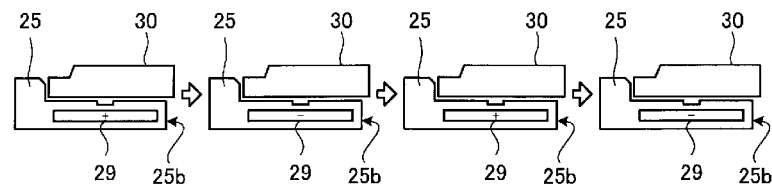
FIG. 9B is a diagram schematically illustrating another exemplary change pattern of the applied voltage.

FIG. 9B is a diagram schematically illustrating another exemplary change pattern of the applied voltage. The example of FIG. 9B is an example of a change pattern of the applied voltage in a case where one electrode plate 29 is formed in the outer peripheral portion 25b. For example, during the plasma processing period, the controller 43 may control the DC power source 28 to apply voltages having different polarities to the electrode plate 29 in cycles.

Figure 9C:
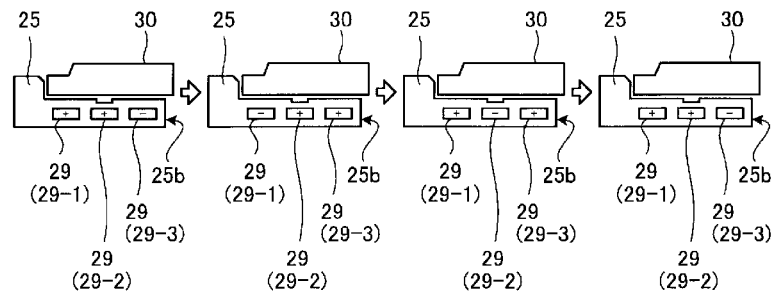
FIG. 9C is a diagram schematically illustrating still another exemplary change pattern of the applied voltage.

FIG. 9C is a diagram schematically illustrating still another exemplary change pattern of the applied voltage. The example of FIG. 9C is an example of a change pattern of the applied voltage in a case where one set of three electrode plates 29 (29-1, 29-2, 29-3) is formed in the outer peripheral portion 25*b*. For example, during the plasma processing period, the controller 43 may control the DC power source 28 to sequentially change the polarities of the voltages applied to the electrode plates 29-1, 29-2, and 29-3 one by one. In the example of FIG. 9C, the polarities of the voltages applied to the electrode plates 29-1, 29-2, and 29-3 are sequentially switched one by one. In the example of FIG. 9C, even when the polarity of the voltage applied to any one electrode plate 29 of the electrode plates 29-1, 29-2, and 29-3 is switched, the voltages applied to the other electrode plates 29 are maintained. Thus, the attraction of the focus ring 30 is capable of being maintained.

Further, a plurality of electrode plates 29 may be arranged on the outer peripheral portion 25*b* side by side in the annular circumferential direction.

Figure 10:
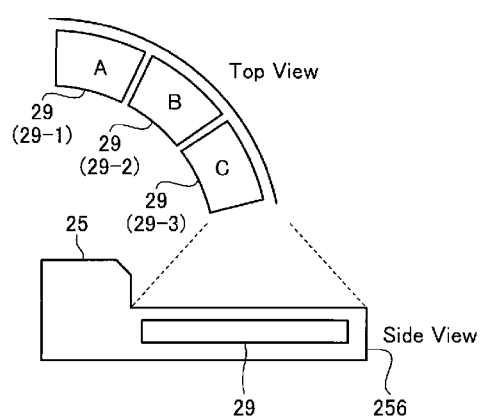
FIG. 10 is a view illustrating an exemplary installation aspect of the electrode plate.

FIG. 10 is a view illustrating an exemplary installation aspect of the electrode plate. FIG. 10 illustrates a schematic top view of the outer peripheral portion 25*b* of the electrostatic chuck 25 in the upper part, and a schematic side view of the outer peripheral portion 25*b* of the electrostatic chuck 25 in the lower part. In the example of FIG. 10, three electrode plates 29 (29-1, 29-2, 29-3) are arranged in the outer peripheral portion 25*b* side by side in the circumferential direction.

Further, in the plasma processing apparatus 1 according to the present exemplary embodiment, descriptions have been made on the case where the attraction of the focus ring 30 is maintained by applying voltages having different polarities to the electrode plate 29 in cycles. However, the present disclosure is not limited thereto. The plasma processing apparatus 1 may apply a voltage having a large absolute value to the electrode plate 29 in steps to maintain attraction of the focus ring 30. For example, during the plasma processing period, the controller 43 may control the DC power source 28 to apply a voltage having a large absolute value to the electrode plate 29 in steps.

Further, in the plasma processing apparatus 1 according to the present exemplary embodiment, descriptions have been made on the case where the controller 43 controls the DC power source 28 to switch the voltage applied to the electrode plate 29 to different polarities in cycles. However, the present disclosure is not limited thereto. In the plasma processing apparatus 1, the DC power source 28 may autonomously switch the voltage applied to the electrode plate 29 to different polarities in cycles.

Figure 11:
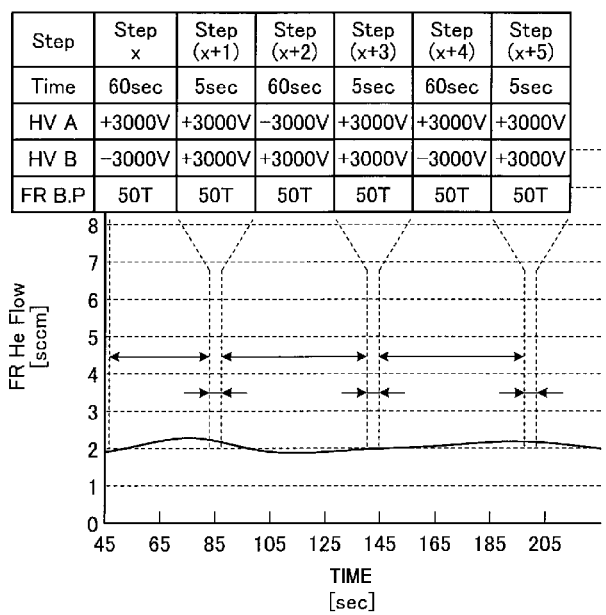
FIG. 11 is a diagram illustrating an exemplary time chart of an electrostatic attraction processing of the exemplary embodiment.

Next, descriptions will be made on an electrostatic attraction processing executed by the controller 43 of the exemplary embodiment. FIG. 11 is a diagram illustrating an exemplary time chart of an electrostatic attraction processing of the exemplary embodiment. FIG. 11 illustrates an example of a time chart in the case of implementing the change pattern of the applied voltage illustrated in FIG. 9A.

In FIG. 11, "Time" is a time of each step, and the unit thereof is set to seconds (sec). "HV A" is a voltage applied to the outer peripheral electrode plate 29-2, and the unit thereof is set to volt (V). "HV B" is a voltage applied to the inner peripheral electrode plate 29-1, and the unit thereof is set to volt (V). "FR B.P" is a pressure of the heat transfer gas supplied to the space sandwiched between the focus ring 30 and the electrostatic chuck 25, and the unit thereof is set to torr. The controller 43 controls the DC power source 28 to sequentially apply the voltage of each step. FIG. 11 also illustrates an example of a result of a test in which the leakage amount of the heat transfer gas is measured when the voltage of each step is sequentially applied. As illustrated in FIG. 11, in the case where the voltages having different polarities are applied in cycles, the leakage amount of He gas may be maintained without being increased even when the plasma processing period is prolonged.

As described above, the plasma processing apparatus 1 according to the present exemplary embodiment includes the susceptor 11 and the DC power source 28. The susceptor 11 is provided with the electrostatic chuck 25. The outer peripheral portion 25*b* of the electrostatic chuck 25 includes the focus ring 30 placed thereon and the electrode plate 29 provided therein so as to face the focus ring 30. The DC power source 28 applies, to the electrode plate 29, voltages having different polarities in cycles or a voltage having a large absolute value in steps, during a plasma processing period. Therefore, the plasma processing apparatus 1 may suppress a decrease in the attraction force of the focus ring 30. As a result, the plasma processing apparatus 1 may ensure the airtightness of the space sandwiched between the electrostatic chuck 25 and the focus ring 30, and suppress an increase in the leakage amount of the heat transfer gas supplied to the space sandwiched between the focus ring 30 and the electrostatic chuck 25 during the plasma processing period.

Further, the outer peripheral portion 25*b* of the electrostatic chuck 25 according to the present exemplary embodiment includes a plurality of electrode plates 29 in the radial direction of the focus ring 30. Therefore, since the voltage applied to each electrode plate 29 is able to be controlled by the plasma processing apparatus 1, it is possible to suppress the attraction force of the focus ring 30 from disappearing all at once. Further, the plasma processing apparatus 1 may control the attraction force for each electrode plate 29 by changing the voltage applied to each electrode plate 29.

Further, the DC power source 28 according to the present exemplary embodiment switches the polarities of the voltages applied to the plurality of electrode plates 29 at once or sequentially one by one. When the polarities of the voltages applied to the plurality of electrode plates 29 are switched at once or sequentially one by one as described above, the plasma processing apparatus 1 may suppress the decrease in the attraction force of the focus ring 30. Further, when the polarities of the voltages applied to the plurality of electrode plates 29 are switched sequentially one by one as described above, the plasma processing apparatus 1 may suppress the attraction of the focus ring 30 from temporarily disappearing at the time of switching the polarities of the voltages.

Further, the DC power source 28 according to the present exemplary embodiment is configured to apply voltages of different polarities to the plurality of electrode plates 29 in each cycle. Therefore, the plasma processing apparatus 1 may weaken an influence on the surroundings due to the voltage applied to each of the plurality of electrode plates 29.

In the above exemplary embodiment, descriptions have been made on an example in which the plasma processing apparatus 1 is configured as a plasma etching apparatus of capacitively coupled plasma (CCP). However, various modifications may be made without being limited to the exemplary embodiment described above. For example, the above-described plasma processing apparatus 1 is the CCP type plasma processing apparatus 10, but may be employed in an arbitrary plasma processing apparatus 1. For example, the plasma processing apparatus 1 may be applied to any type of inductively coupled plasma (ICP), radial line slot antenna, electron cyclotron resonance plasma (ECR), and helicon wave plasma (HWP).

Further, in the above exemplary embodiment, descriptions have been made on an example in which plasma etching is performed on the wafer W as a substrate. However, the present disclosure may be applied to other plasma processing apparatuses that perform a plasma processing on, for example, a glass substrate (e.g., a flat panel display (FPD)) as a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a processing chamber configured to perform a plasma processing using plasma;
   a placing table provided in the processing chamber and including a substrate placing portion and a focus ring placing portion, the focus ring placing portion surrounding the substrate placing portion;
   a focus ring disposed on the focus ring placing portion;
   a first electrode and a second electrode both annularly disposed inside the focus ring placing portion, the second electrode being disposed radially outside the first electrode;
   a DC power source configured to apply a first DC voltage to the first electrode and apply a second DC voltage to the second electrode; and
   a controller configured to control the DC power source such that respective polarities of the first DC voltage and the second DC voltage are independently and periodically switched to become different from each other, thereby maintaining an attraction force of the focus ring to the focus ring placing portion of the placing table;
   wherein a switching of the polarity of the first DC voltage is simultaneously performed with a switching of the polarity of the second DC voltage such that the first DC voltage and the second DC voltage have different polarities from each other.

2. The plasma processing apparatus according to claim 1, wherein the controller is further configured to control the DC power source such that the respective polarities of the first DC voltage and the second DC voltage are switched, thereby restoring a migration of charge that has occurred between the placing table and the focus ring due to the first DC voltage and the second DC voltage applied to the first electrode and the second electrode, respectively.

3. The plasma processing apparatus according to claim 2, wherein a switching period of each of the polarities of the first DC voltage and the second DC voltage becomes shorter as a power density becomes higher.

4. The plasma processing apparatus according to claim 2, wherein the respective polarities of the first DC voltage and the second DC voltage are switched such that a leakage amount of a heat transfer gas flowing between the focus ring and the placing table is maintained.

5. The plasma processing apparatus according to claim 1, wherein a switching of the polarity of the second DC voltage is performed after a switching of the polarity of the first DC voltage such that the first DC voltage and the second DC voltage have different polarities from each other.

6. The plasma processing apparatus according to claim 1, wherein the first electrode and the second electrode are provided in a radial direction of the focus ring.

7. The plasma processing apparatus according to claim 1, wherein the first electrode is arranged below an inner peripheral bottom surface of the focus ring, and the second electrode is arranged below an outer peripheral bottom surface of the focus ring.

* * * * *